US009640486B2

(12) United States Patent
Richter et al.

(10) Patent No.: US 9,640,486 B2
(45) Date of Patent: May 2, 2017

(54) INGOT MARKING FOR SOLAR CELL DETERMINATION

(75) Inventors: Andre Richter, Handeloh-Worme (DE); Marcel Krenzin, Berlin (DE); Jens Moecke, St. Antoni (CH)

(73) Assignee: Conergy AG, Hamburg (DE)

( * ) Notice: Subject to any disclaimer, the term of this patent is extended or adjusted under 35 U.S.C. 154(b) by 829 days.

(21) Appl. No.: 12/663,890

(22) PCT Filed: Jun. 13, 2007

(86) PCT No.: PCT/EP2007/005212
§ 371 (c)(1),
(2), (4) Date: Jun. 8, 2010

(87) PCT Pub. No.: WO2008/151649
PCT Pub. Date: Dec. 18, 2008

(65) Prior Publication Data
US 2010/0237514 A1    Sep. 23, 2010

(51) Int. Cl.
*G06K 19/06* (2006.01)
*H01L 23/544* (2006.01)
(Continued)

(52) U.S. Cl.
CPC ...... *H01L 23/544* (2013.01); *H01L 21/67282* (2013.01); *H01L 2223/54413* (2013.01);
(Continued)

(58) Field of Classification Search
CPC ............ Y10S 438/973; G03F 7/70483; G03F 7/70591; G03F 7/70608; G03F 7/70616;
(Continued)

(56) References Cited

U.S. PATENT DOCUMENTS 5,060,043 A * 10/1991 Yasue ...................... 428/66.7
5,700,732 A * 12/1997 Jost et al. ................ 438/401
(Continued)

FOREIGN PATENT DOCUMENTS

EP   0 604 061 A   6/1994
JP   55-072034 A   5/1980

*Primary Examiner* — Mary Wilczewski
*Assistant Examiner* — Tsz Chiu
(74) *Attorney, Agent, or Firm* — Kilpatrick Townsend & Stockton LLP

(57) ABSTRACT

The invention relates to a method for marking wafers, in particular wafers for solar cell production: The method comprises the steps of manufacturing a position line (21a, 21b, 21c) on a peripheral surface of a silicon ingot or column, the ingot or column extending in an axial direction and having a longitudinal axis in the axial direction, wherein the position line extends in the axial direction along substantially the whole ingot or column and is inclined with respect to the longitudinal axis. By this position line it is possible to determine the position of a wafer cut from the ingot or column within the ingot or column, respectively. Further, an individual identification pattern (20a, 20b, 20c) of lines on the peripheral surface of the silicon ingot or column is manufactured, the individual identification pattern of lines extending in axial direction over substantially the whole ingot or column and providing an individual coding which allows to identify the silicon ingot or column.

5 Claims, 5 Drawing Sheets

Figure 2:
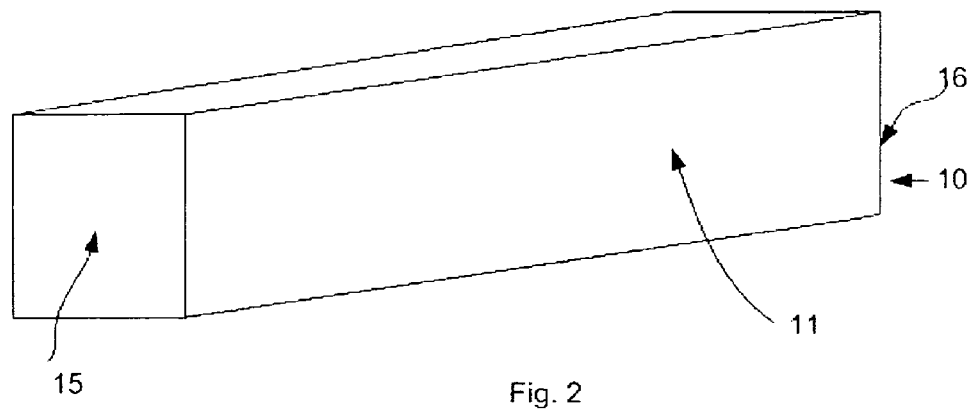

(51) Int. Cl.
  *B07C 5/34*  (2006.01)
  *G06K 7/10*  (2006.01)
  *H01L 21/67* (2006.01)

(52) U.S. Cl.
  CPC .............. *H01L 2223/54493* (2013.01); *H01L 2924/0002* (2013.01)

(58) Field of Classification Search
  CPC ............ G03F 7/70625; G03F 7/70641; G03F 7/7065; G03F 7/70658; G03F 7/70666; G03F 7/70675; G03F 7/70683; G03F 1/0092; G03F 9/702; G01N 21/956; G06T 7/0004
  USPC ..... 257/E21.214, E23.179; 438/401, 16, 800
  See application file for complete search history.

(56) References Cited

U.S. PATENT DOCUMENTS

| | | | |
|---|---|---|---|
| 5,907,144 A * | 5/1999 | Poon et al. ............... | 235/462.08 |
| 6,120,950 A * | 9/2000 | Unno ................... | G02B 5/1857 |
| | | | 356/399 |
| 6,268,641 B1 * | 7/2001 | Yano et al. .................. | 257/620 |
| 6,797,585 B1 | 9/2004 | Meyer et al. | |
| 7,007,855 B1 * | 3/2006 | Barker et al. ................. | 235/494 |
| 2004/0259277 A1 | 12/2004 | Hofmeister | |
| 2009/0057837 A1 * | 3/2009 | Marshall ........... | H01L 21/02005 |
| | | | 257/618 |

* cited by examiner

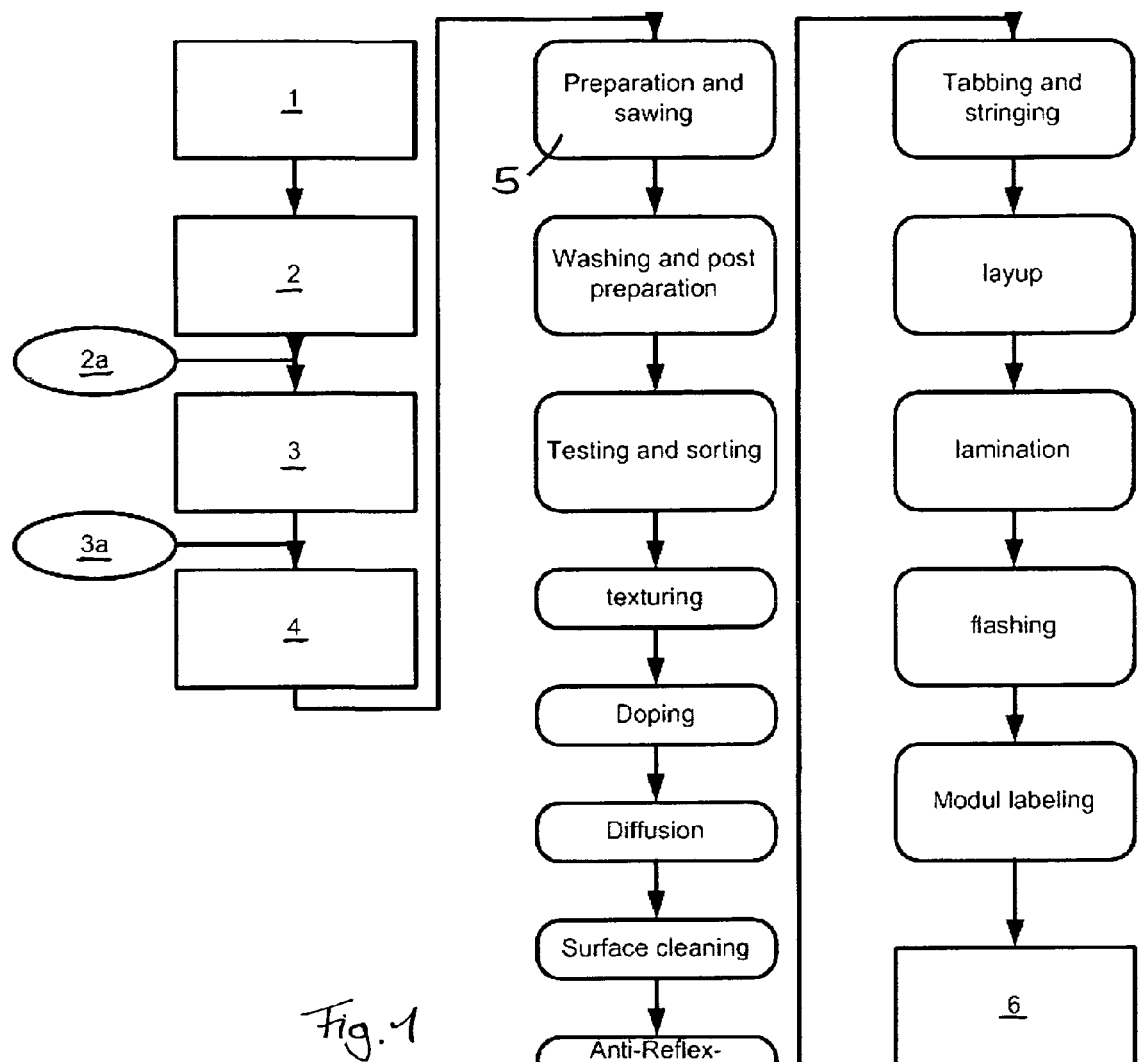
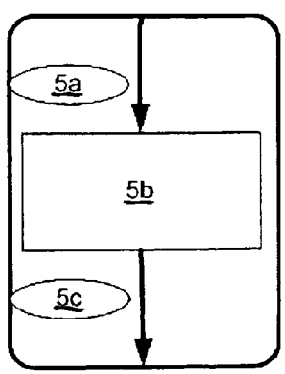
Fig. 1
Fig. 1a

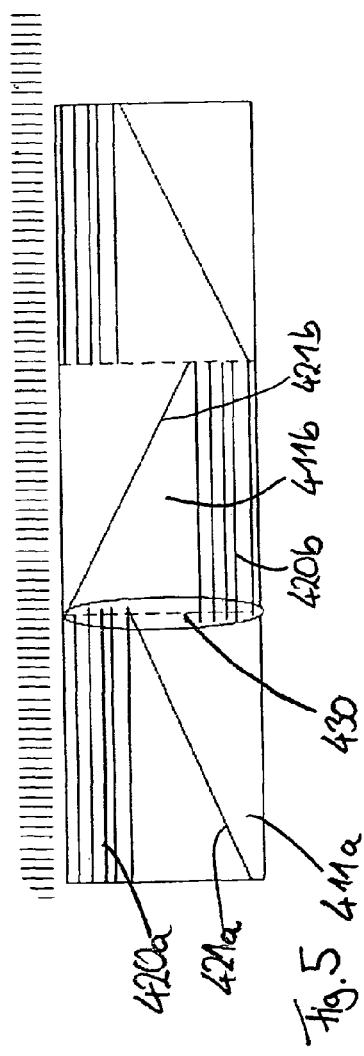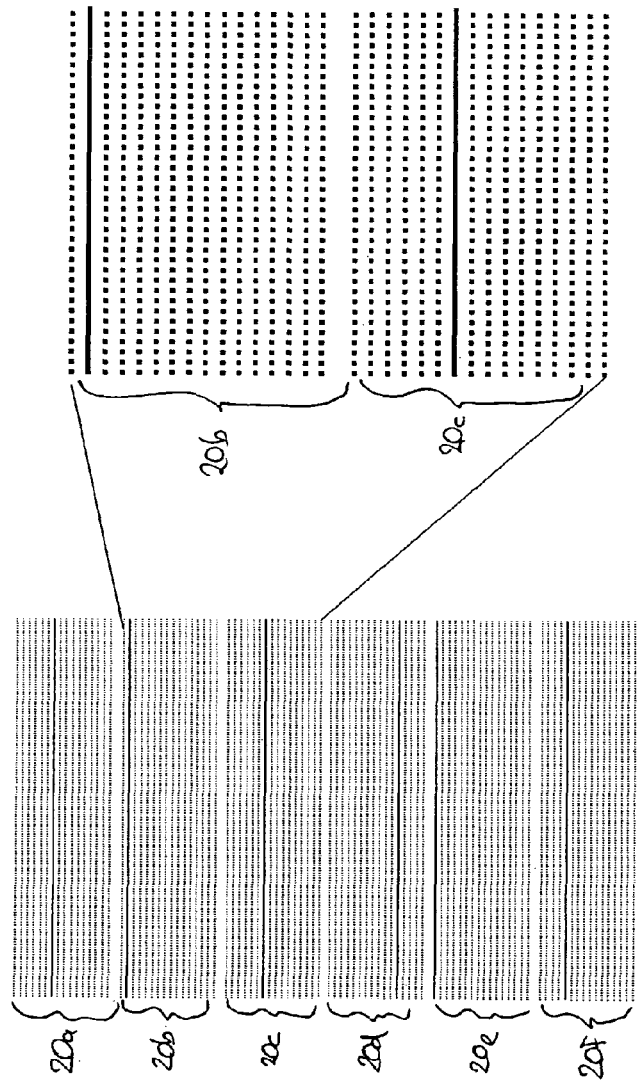

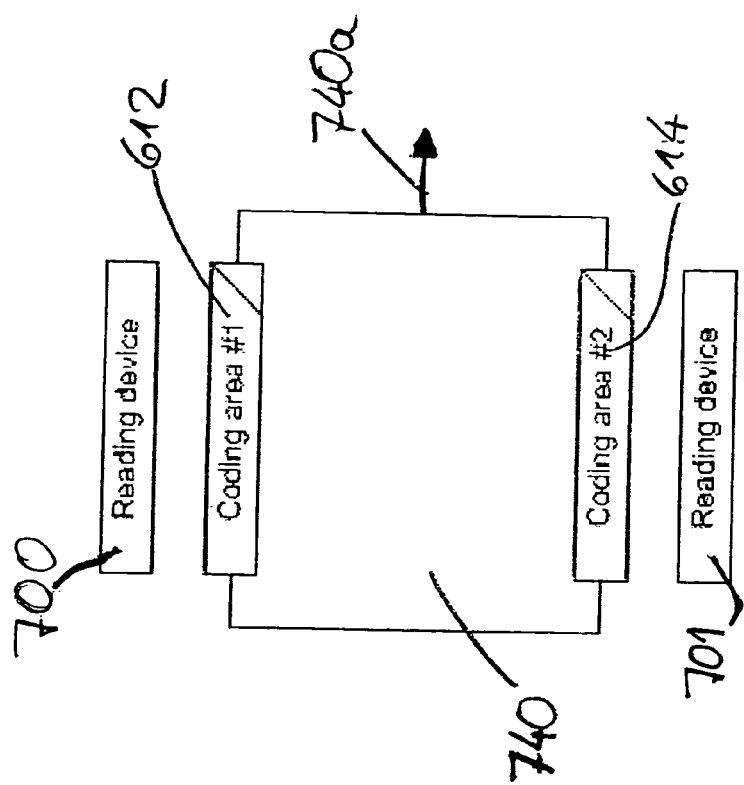
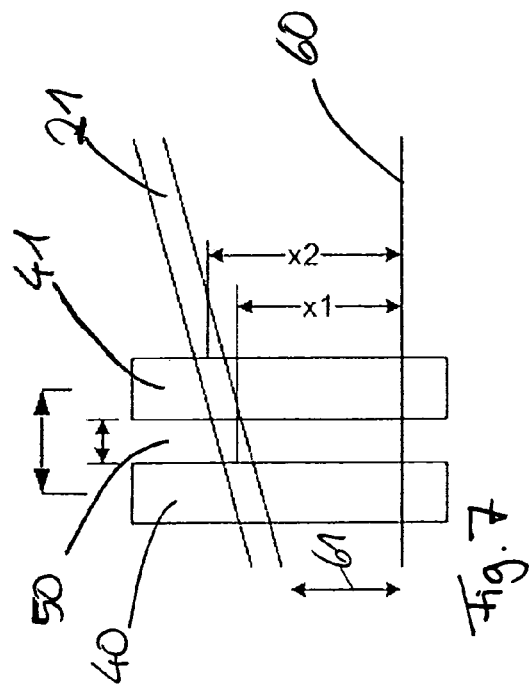
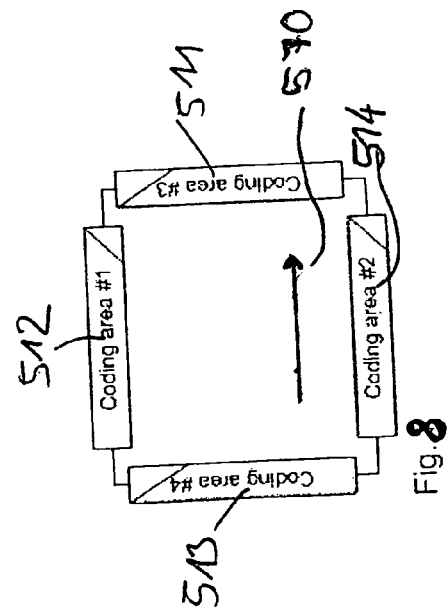

INGOT MARKING FOR SOLAR CELL DETERMINATION

CROSS-REFERENCE TO RELATED APPLICATIONS

This application is the U.S. National Stage entry under §371 of International Application No. PCT/EP07/05212, filed Jun. 13, 2007, the contents of which are herein disclosed in their entirety.

The invention relates to a method for marking wafers, in particular wafers used for solar cell production The invention further relates to a method of manufacturing silicon wafers, in particular for solar cell production and to a silicon wafer, ingot or column.

The manufacturing process of semiconductor devices such as solar cells is very sensitive to process parameters of the manufacturing process, environmental conditions, the location of the wafer within the ingot the wafer was cut from and the like.

In order to allow quality control, to optimize the manufacturing process and to establish a manufacturing routine which allows cost-efficient production of semiconductor devices with low rejections of the final product, it is required to assign the manufacturing parameters to each manufactured semiconductor device. In the course of such documentation of process parameters for the semiconductor devices it is required to mark such semiconductor devices in order to allow assignment of the process parameters to one specific semiconductor device such as a wafer by its identification marking.

U.S. Pat. No. 6,112,738 proposes a method, wherein silicon wafers are marked on their slicing surface using laser marking technology. A similar method is disclosed in EP 0 616 364 A1. Such methods allow the marking of very thin wafers by slicing a silicon ingot or column into a plurality of thin wafers and marking the wafers on the such manufactured slicing surfaces. However, such marking method must be carefully conducted to avoid damages to the wafer. Further, if it is required to also allow identification of the ingot the wafers were cut from a precise handling routine of each single wafer after slicing is required. Further, such marking methods are time-consuming since each wafer has to be marked separately by a certain order of numbers, letters or combination thereof. The original location of the wafer within the ingot cannot be determined using such marking method.

U.S. Pat. No. 4,632,884 proposes an identical marking of wafers on the slicing surface and further includes cutting of a selected corner of a rectangular wafer to distinguish between the front and back sides of the wafer and to identify crystal orientation. However, this method has the main drawback that still the location of the wafer within the ingot cannot be determined and that each wafer has to be marked in an individual step. In particular solar wafers use the whole slicing area of a wafer and thus should be uniform and not affected by a marking on this surface when they are used in a solar module.

JP 07050328 A, JP 09070740 A, JP 60045011 A and JP 57052124 A disclose similar methods wherein the slicing surface of a wafer is marked individually.

From JP 01192121 A, JP 02130850 A and JP 57043410 A it is known to apply one single marking line to the peripheral surface of an ingot. This single marking line is inclined with respect to the longitudinal axis of the ingot and is arranged on a flattened peripheral surface section of the ingot. After the wafers have been cut from this ingot, the original position of each wafer in the ingot can be calculated by measuring the position of the marking line on the peripheral surface of the wafer. However, this method does not allow to determine the ingot the wafer was cut from and thus requires further individual marking of the wafers on the slicing surface.

WO 01/66361 A1 discloses a method, wherein a plurality of labels is applied to the periphery of an ingot, comprising one label for each wafer which is to be cut from the ingot. Each label comprises an individual code of numbers and letters and is positioned such, that it is placed on the periphery of a wafer after slicing the ingot. This method allows for individual marking of each wafer but is limited to wafers of large thickness to provide the space required for the label of numbers and letters. Since wafers are manufactured with very low thickness today, such method cannot be used in modern wafer production, in particular in such particular thin wafers used for solar cell production.

It is a first objection of the invention to provide a method for marking wafers which is less time-consuming than the methods described above but still provides significant information about the origin of the wafer and allows individual identification of the wafer.

It is a further object of the invention to provide a method for marking wafers minimizing the space required for the coding area on the wafer.

Further, it is an object of the invention to provide a method which allows identification of the wafer starting from the beginning of its manufacturing process.

Due to the large number of wafers and since all wafers are uniform in solar cell manufacturing, quality control in solar cell production was made on the basis of virtual wafer tracking. Such virtual tracking only allows statistical calculation to trace back the properties of a group of wafers in the process which is a quite unprecise approach. Using virtual tracking, special treated and prepared wafers cannot be tracked. However, conventional methods do not allow direct numbering of each wafer due to their small dimensions and large number.

Thus, it is a particular object of the invention to provide a method for marking wafers which is well-suited for the production of solar cells. Solar cells require specific features since they are produced in very large amounts and since it is not desired to use larger regions on the wafer for the purpose of marking since these regions will not contribute to the function of the solar cell itself. Thus, in present manufacturing processes of solar cells, no marking is performed to avoid these drawbacks. However, since efficiency, quantum efficiency and homogenous distribution of the concentrations within the solar cell can only be measured at the end of the manufacturing process in total, it would be very interesting to allow marking of solar cells to identify relevant manufacturing process steps and to optimize these and to allow quality control.

These and other objects are achieved according to the invention by a method for marking wafers, in particular wafers for solar cell production, comprising the steps manufacturing a position line on a peripheral surface of a silicon ingot or column, the ingot or column extending in an axial direction and having a longitudinal axis in the axial direction, the position line extending in the axial direction along substantially the whole ingot or column and being inclined with respect to the longitudinal axis and allowing to determine the position of a wafer cut from the ingot or column within the ingot or column, respectively, manufacturing an individual identification pattern of lines on the peripheral surface of the silicon ingot or column, the individual identification pattern of lines extending in axial direction over substantially the whole ingot or column and providing an individual coding which allows to identify the silicon ingot or column.

The invention is to be discussed in connection with the usual routine of manufacturing wafers. This routine includes the production of an ingot by controlled crystal growth. Such ingots usually have a dimension according to a cylinder or a rectangular block and extend along a longitudinal axis of the cylinder or block, respectively. An axial front and end surface and a crystal growth direction are defined. In a second manufacturing step, the ingot may be subjected to a squaring procedure, wherein at least one, preferably four flattened surfaces of the ingot are produced by cutting it along its periphery in a longitudinal direction. Often, by this a cubic ingot is produced extending in its longitudinal direction.

Alternatively, the ingot may be divided into three, four or even more columns by cutting it along its longitudinal direction several times. These columns will have a smaller cross section than the ingot.

In a subsequent manufacturing step, wafers are cut from such ingots or columns by a slicing procedure. In such slicing procedure the wafer is cut in cross-sectional direction multiple times using a bandsaw. A plurality of slices, namely the wafers, are obtained and can be subjected to further manufacturing steps like masking, etching, doping or the like.

A first aspect of the method according to the invention is to provide the marking on the peripheral surface of the wafer. By this, it is possible to apply the marking onto the ingot or column before slicing it into a plurality of wafers. However, it is to be understood that the method may be applied to wafers after having been sliced also, for example by arranging the wafers individually or side by side in a receptacle and marking them in one marking step.

A second aspect of the method according to the invention is that a position line and an individual identification pattern are provided. By this, the ingot or column of which the wafer originates can be identified by the individual identification pattern. Since the individual identification pattern is composed of a plurality of lines, the method allows for easy read procedures and a large number of individual codings on a small surface. Further, the method according to the invention allows for determining the position of each single wafer in the ingot or column it was cut from by the inclined position line. Thus, the method according to the invention allows to exactly determine all relevant data to allow quality control such as the exact origin of each single wafer with respect to the ingot/column and the position within the ingot/column.

The invention allows to mark wafer in a very economic way. Further, the wafers can be marked at the very beginning of the process and the wafer position in the ingot or column block can be determined even after the ingot or column block has been sliced. Each wafer can be traced individually through all production steps and this can be done on the fly without influencing the production since the marking can be accessed very simple. The solar cell parameters are not influenced by the marking according to the invention.

The lines used for marking according to the invention can be applied by different methods, e.g. laser writing, mechanical scratching, water beam scratching and printing with special ink. The special ink may be adapted to locally change the properties of the silicon, e.g. the lifetime and/or the appearance in light. This will result in very low stress induction in the silicon since no mechanical treatment is performed.

Since the peripheral edge of a solar cell wafer will undergo an isolation treatment, this further enhances the method according to the invention since any defects or damages caused by the marking will be covered by the isolation material.

According to a first preferred embodiment of the invention the individual identification pattern of lines comprises a plurality of parallel lines which are distanced from each other, wherein the individual pattern is provided by an individual sequence of distances between the plurality of lines. This sort of individual identification pattern allows for simple manufacturing of the marking and safe reading of the marking with a low reading failure rate on all surface characteristics occurring in the process of wafer production. The distance may be chosen such that a zero distance can be selected as lower limit, resulting in the lines being arranged directly adjacent to each other and thus producing a line of double or multiple thickness. Starting from this, individual distances between the lines may be selected or one predetermined distance may be selected and the lines may be distanced from each other by this predetermined distance or multiples of this distance.

It is further preferred that the individual identification pattern is manufactured based on a matrix pattern, the matrix pattern being a grid line pattern having a number of parallel grid lines at a constant distance to each other and the individual pattern is provided by manufacturing a selected set of grid lines of the grid line pattern. The application of a predefined matrix pattern will further reduce the reading failure rate and allow for safe reading of the markings made according to the method of the invention.

Basically, the coding system could be based on a binary coding technique or could use decimal or hexadecimal coding techniques involving sets of ten or sixteen lines. However, it is an object to minimise marking time and thus a coding technique would be desirable which requires only few lines which are to be manufactured. In a preferred embodiment the matrix patterns comprises a number of n matrix pattern fields, each matrix pattern field comprising a number of m lines and the individual pattern is provided by manufacturing one selected line in each matrix pattern field, thus resulting in $m^n$ different codings. This will allow to allocate a coding system comprising high numbers of different codings in a small space and will save marking time since only a few lines (namely n lines, one in each field) have to be manufactured.

Alternatively or additionally the individual identification pattern of lines comprises a plurality of parallel lines which are distanced from each other, the lines being of different thickness and wherein the individual pattern is provided by an individual sequence of thicknesses of the plurality of lines. Since the thickness of a line can be measured rather exactly, this may serve to provide an individual pattern, e.g. by providing two different predetermined thicknesses of the lines or more.

Still further, the method may be improved in that the individual identification pattern of lines comprises a plurality of parallel lines which are distanced from each other, the lines being of different depth and wherein the individual pattern is provided by an individual sequence of depths of the plurality of lines. This embodiment is in particular applicable when manufacturing the lines by scratching, engraving, laser shaping or the like. The variation in depth may be combined with the variation in thickness as discussed above. Further, the variation in depth and/or thickness may be combined with the embodiments comprising an individual pattern of lines. This will allow to store large volumes of data on a small surface section of the wafer (i.e. on the peripheral edge of the wafer).

According to a further preferred embodiment, the individual identification pattern of lines comprises a plurality of parallel lines which are distanced from each other, the lines being inclined with respect to the axial direction and comprising the inclined position line. By this, the whole individual identification pattern is inclined and thus allows for identification of the ingot or column of which the wafer was cut from and of the position of the wafer in this ingot or column. Thus, a separate position line is not required and the function of the position line is taken over by the lines of the individual identification pattern.

Usually, the position of the wafer in the ingot can be calculated by measuring the distance between the position line and an edge of a flattened surface onto which the position line is manufactured or another angular reference mark. The method may be further enhanced by the step of manufacturing a base line which extends in parallel to the longitudinal axis of the ingot or column. This base line will facilitate to determine the position of the wafer in the ingot or column since the position can be easily calculated from a distance between the base line and the inclined position line.

The base line and/or the position line may set as double line to facilitate recognition of these lines.

According to a further preferred embodiment, the peripheral surface is divided into a plurality of axial surface sections and an inclined positioning line is manufactured for each axial surface section. This embodiment is particularly useful when marking larger ingots since the angle of inclination of the position line cannot be reduced under a specific minimum since then the preciseness of the measurement of the distance between the inclined line and a reference line, like e.g. the base line, would not be sufficient to exactly determine the position of the wafer in the ingot. Thus, it is preferable to have a larger inclination angle. This can be realized by arranging two or more position lines on the ingot in axial sequence to each other. Since in such case two or more wafers with the same distance of the position line to a reference line would be present, each axial surface section should be marked with different individual identification patterns to distinguish between the wafers cut from the different axial sections of the ingot/column.

According to a further preferred embodiment, the step of manufacturing the position line and the individual identification pattern is done before the step of slicing the ingot or column into a number of wafers. As discussed before, the method according to the invention in particular has the advantage that marking can be done before the slicing since it is not required to first produce a slicing surface and to subsequently mark this slicing surface. The marking is done onto the peripheral surface of the ingot. By this, an ingot or column can be marked in one manufacturing step and hereinafter the ingot or column can be sliced without the risk that the marking is damaged or removed.

Still further it is preferred, that the position line and the individual identification pattern are positioned on a flattened surface of the periphery of the ingot or column the method in particular comprising a step of cutting the ingot or column in an axial direction to provide such a flattened peripheral surface. Generally, the marking according to the invention can be applied to the cylindrical, peripheral surface of an ingot or a column but since it may be required in subsequent manufacturing steps to flatten the ingot or column, e.g. by doing a squaring procedure, it is preferred to mark the ingot or column before such squaring procedure or the like and to mark the such provided flattened surface which may be produced by a squaring procedure. To achieve this, after production of the ingot or column, at least one flattened surface must be provided by a respective cutting procedure in an axial direction.

Still further, it is preferred that at least two marking areas having the same coding are defined on one axial section of the ingot or column, each marking area extending in an axial direction over substantially the whole axial section and comprising a position line and an individual identification pattern. By this, redundant markings each comprising a position line and an individual identification pattern are provided on the wafers to facilitate reading of the markings and to further minimize the risk of read errors or reading failure. In particular, the marking areas can be arranged opposed to each other in such a way, that two or four marking areas are provided.

According to another preferred embodiment, the marking in the marking areas is configured asymmetrical in such a way to define an axial top and bottom face of the ingot or column and/or to define a crystal orientation within the ingot or column, respectively. According to this embodiment, the order of arrangement of the position line and the individual identification pattern can be altered in such a way as to define a coding which gives information about the crystallization direction and defines axial top and bottom faces of the ingot or column. This will allow to determine the orientation of the wafer in the ingot or column which is required for selective etching procedures or the like in subsequent manufacturing steps. In particular when applying two or more marking areas in one axial section, such asymmetrical configuration may be provided.

According to a further preferred embodiment, two position lines are manufactured adjacent to each other, each position line extending in axial direction over substantially the whole ingot or column, wherein the inclining angle of the two position lines is different, in particular contrary to each other. This will allow to measure the distance between the two position lines and to calculate from this distance the position of a wafer in an ingot or column. Since the two position lines will diverge from each other, a specific distance between the lines will always represent a specific position in an ingot or a column. In particular, one of the position lines can be regarded as reference base line which is not necessarily oriented in exactly the longitudinal direction of the ingot or column but it can be at an inclined angle as well, which may save space in certain applications.

According to a further aspect of the invention, a method of manufacturing silicon wafers is provided, in particular such silicon wafers for solar cell production, the method comprising the steps:

texturing, doping and diffusion treating the wafer to produce characteristic semiconductor properties, in particular solar cell properties, reading an individual identification pattern comprising a number of lines on the peripheral edge of the wafer to identify the ingot or column the wafer was cut from, reading a marking having a position line on the peripheral edge of the wafer which is inclined with respect to a longitudinal line of an ingot or column the wafer was cut from to identify the position of the wafer within the ingot or column.

According to this aspect of the invention, during the manufacturing process specific reading procedures are performed to allow for documentation of the manufacturing process and each single step of this process with respect to the specific ingots, columns or wafers treated, respectively. This reading of markings can be used to control the manufacturing process and to document the sequence of manufacturing steps and its parameters. By reading an individual identification pattern and a position line on the peripheral edge of the ingot, column or wafer, respectively, it is possible to exactly determine the origin of the material which is treated.

The method may be improved by the step of slicing an ingot or column into a number of wafers and marking the ingot or column, wherein the marking step is preferably done before the slicing step. To this regard it is referred to the explanation of the manufacturing sequence as discussed above with regard to the respective method for marking.

Still further, the method may be improved by the steps of
squaring an ingot or column by cutting it in an axial direction and
marking the ingot or column on at least one of the flattened surfaces provided by the squaring process.

To this extent it is again referred to the respective marking method and its explanation above.

According to a third aspect of the invention, a silicon wafer, ingot or column is provided, comprising
a position line on a peripheral surface of the wafer, ingot or column, the position line extending in an axial direction over substantially the whole ingot or column or the whole wafer, respectively and being inclined with respect to the longitudinal axis of the ingot, column or the ingot or column the wafer was cut from, respectively,
the position line allowing to determine the original position of a or the wafer in the ingot/column it was cut from, respectively,
an individual identification pattern of lines on the peripheral surface of the wafer, ingot or column, the individual identification pattern of lines extending in the axial direction over substantially the whole ingot or column or the whole wafer, respectively,
the individual identification pattern providing an individual coding which allows to identify the silicon ingot or column or the silicon ingot or column the wafer was cut from.

Such wafer, ingot or column provides the advantage that each wafer can be identified with respect to its origin and its position in the original ingot or column by a simple reading procedure of the markings on the peripheral surface and thus such wafer, ingot or column allows for quality control in its manufacturing process and improved control of the manufacturing process itself.

The silicon wafer, silicon ingot or column may be further improved in that the position line and the individual identification pattern are manufactured according to a marking method as described above. This will further enhance the features of the markings on the wafers and thus reduce the risk of reading errors or failure and allow for fast marking of the wafer, ingot or column.

The invention will be further explained by way of exemplary preferred embodiments referring to the attached drawings.

FIG. 1: shows an example for a solar cell production process incorporating the invention.

FIG. 1a: shows an example for an inner process step according to FIG. 1.

FIG. 2: shows an example for a one-side marking of an ingot.

Figure 3:
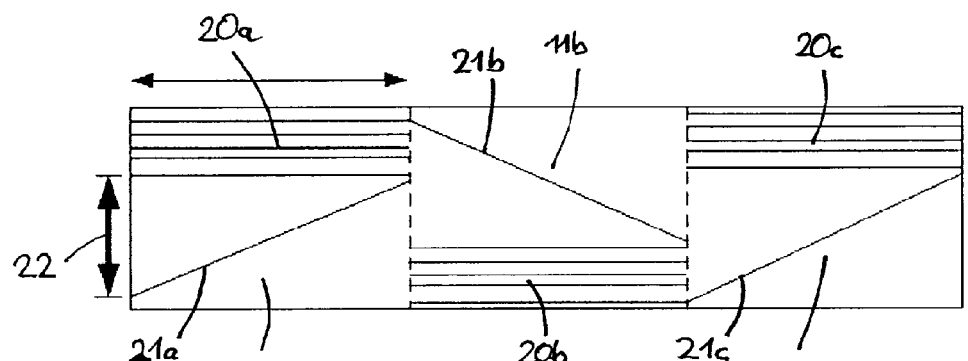

FIG. 3: shows a marking in three axial surface sections with variations of the marking code.

Figure 4:
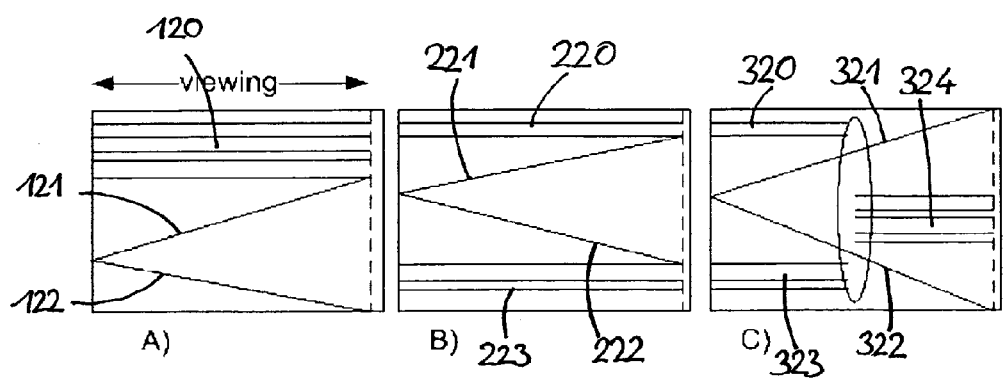

FIGS. 4a-c: show different variations of the marking code.

FIG. 5: shows an embodiment with three axial marking sections and an interference between the first two sections.

FIG. 6: shows an example of the coding of the individual identification pattern.

FIG. 6a: shows a detail of the coding of the individual identification pattern according to FIG. 6.

FIG. 7: shows a schematical arrangement of the position line demonstrating the geometrical conditions to calculate the original position of a wafer.

FIG. 8: shows a schematical top view of a wafer having four marking areas.

FIG. 9: shows a schematic top view onto a wafer having to marking areas and moving through a reading device.

Figure 10:
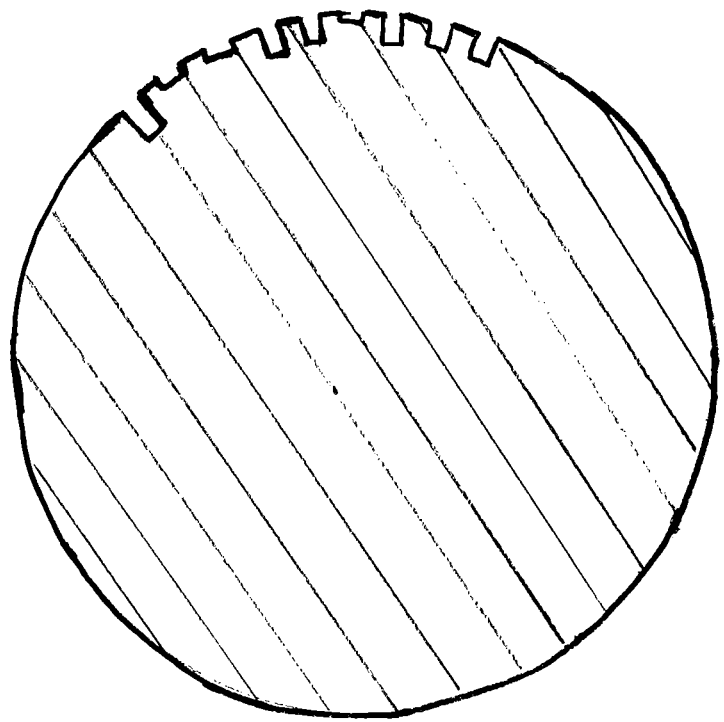

FIG. 10: shows a schematic cross sectional view of a wafer wherein in the individual pattern, an individual sequence of depths of the plurality of lines is shown.

Referring first to FIG. 1, the production of solar cells starts with producing of an ingot in step 1 and squaring this ingot by performing cuts in an axial direction in step two.

After step 2 the squared ingots may be marked in a marking step 2a using a marking method according to the invention.

Hereafter, in a further production step 3, the squared ingots are grinded and hereafter, as an alternative to step 2a, the grinded ingots may be marked in a step 3a.

Hereafter, an optional block labelling may take place as step 4.

After these steps the ingot is prepared and sawed to slice the ingot into a plurality of wafers in step 5.

Step 5 and all subsequent steps of the manufacturing process may include an input reading step 5a to identify the wafer, a manufacturing process 5b like sawing or washing or the like and an output reading step 5c to identify the wafer after the process 5b has been conducted.

Following the slicing step 5, a number of subsequent steps like
washing and post-preparation,
testing and sorting,
texturing,
doping,
diffusion,
surface cleaning,
anti-reflex-deposition,
printing,
firing,
edge isolation,
testing and sorting,
tabbing and stringing,
layup,
lamination,
flashing, and
module labelling
can be conducted to produce the solar cell in its desired configuration and as a subsequent final step a custom read-out will be done in step 6.

Referring to FIG. 2, an ingot 10 is squared to have a front surface 15 and an end surface 16 and number of four side surfaces extending in longitudinal direction, wherein side surface 11 is prepared to be marked.

FIG. 3 shows an example of marking in different sections on the marking side. A first marking section 11a is followed by a second marking section 11b and a third marking section 11c. In marking section 11a an individual identification pattern 20a is arranged in the upper region of the section. In the lower region of the section, an inclined position line 21a is present. The position of each wafer cut from this marking section 11a can be calculated by measuring the distance between the bottom code line of the individual identification pattern and the inclined position line at the start of the section based on a known distance 22 between these two lines and a known inclination angle of the position line.

In marking section 11b the individual identification pattern 20b is arranged in the lower region of the section and an inclined position line 21b is arranged in the upper region of the section and is inclined in a different angle when compared to position line 21a. By this, any interference between the markings in marking section 11a and those in marking section 11b can be avoided.

Consequently, in marking section 11c the individual identification pattern 20c is positioned in the upper region and the inclined position line 21c in the lower region of the marking section.

FIGS. 4a-c show examples of further variations of the position line and the individual identification patterns. In FIG. 4a an individual identification pattern serving as a coding to identify the ingot or column is arranged in the upper region of the marking section and two position lines inclined in contrary angles to each other 121, 122 are present in the lower region of the section.

In FIG. 4b a first part 220 of the individual identification pattern is arranged in the upper region of the section and a second part 223 of the individual identification pattern is arranged in the lower region of the section. Between these two parts of the individual identification pattern 220, 223 two position lines 221, 222 which are inclined in a contrary angle to each other are present.

FIG. 4c demonstrates on the left side a similar arrangement having two parts of individual identification pattern 320, 323 in the upper and lower region of the marking section and inclined position lines 321, 322 extending over the whole section. The individual identification pattern parts 320 323 in the upper and lower region are not further present in the right hand side of the section and instead there is provided one single individual identification pattern 324 in the middle region. The patterns 320, 323 on the left hand side and the pattern 324 on the right hand side overlap in the central axial region of the section and by its arrangement do not interfere with the inclined position lines 321, 322.

FIG. 5 shows another example of markings in axial surface sections. In a first axial section 411a an individual identification pattern 420a is arranged in the upper region and an inclined position line 421a in the lower region. Adjacent to this first axial section a second axial section 411b is arranged having an individual identification pattern 420b in the lower region and an inclined position line 421b in the upper region. The individual identification pattern 420a extends a small amount in the second axial section 411b and the individual identification pattern 420b extends a small amount in the first axial section 411a. In the same way, the inclined position line 421a extends a small amount in the second axial section 411b and the inclined position line 421b extends a small amount in the first axial section 411a. By this, it is assured that a reading of the markings can be performed independently of the position of the slicing cut and each wafer can be determined with regard to its origin ingot and its position in the origin ingot.

FIG. 6 shows schematically an example of an individual identification pattern based on a matrix pattern which is a grid line pattern with lines shown to basis 16. Only those lines shown in continuous lines are marked whereas the lines shown in dotted lines are not marked. As shown in this example, place no. 1 corresponding to 4 and place no. 2 corresponding to 7 are marked in this example. The coding comprises a number of six matrix pattern fields 20a-f (N=6). Each matrix pattern field comprises a total of sixteen lines (M=16). The position of each line is predetermined and the position of each line is depicted in dotted lines in FIGS. 6 and 6a. Only one line is manufactured in each matrix pattern field and this line is depicted as continuous line in FIGS. 6, 6a. Thus, it can be seen that in the matrix pattern fields 20b and 20c the second line and the seventh line, respectively, are manufactured in the coding scheme shown in FIGS. 6, 6a, thus only six lines have to be manufactured to provide an individual coding and thus 16.777.215,00 different individual codings can be manufactured with this coding scheme.

FIG. 7 schematically shows the calculation of the position of a wafer in an ingot using the position line. A position line 21 is provided at a predetermined inclined angle. A first wafer (not shown) has a known distance 61 between the position line 21 and a base line 60. Wafer no. N40 is positioned in such a positioned in such a position where the distance between the position line 21 and the base line 60 is X1. A second wafer 41 is positioned such that the distance between position line 21 and base line 60 is X2. Between the wafers 40 and 41a curve loss 50 is present which is a result of the slicing process. As will be apparent to the skilled person, the position of each wafer in the ingot can be calculated when knowing the distance 61 of the first wafer, the angle of inclination of the position line 21, the thickness of the wafers and the curved loss by measuring the distance between the position line 21 and the base line 60 for the wafer which position is sought for.

FIG. 8 shows a top view onto a wafer which has been marked on each of the four flattened sides. As it is schematically shown, the arrangement of the markings in the different marking areas 511, 512, 513, 514 is different, thus producing an asymmetrical coding which allows to define and determine a crystal orientation 570 of the wafer.

It should be noted, that the number of marked surfaces can be more or less than four, too. In particular applications, markings may be applied to other surfaces, e.g. to all eight surfaces of an octagonal shape.

Further, in FIG. 9 a top view of a wafer 740 if shown having two marking areas 612, 614 being arranged on opposed peripheral sides of the wafer. The wafer 740 is moving in a direction 740a and thus passes reading devices 700, 701 which are adapted to read the codings in marking areas 612, 614, respectively. By this, simultaneous reading of the codings in the marking area 612 and 614 and be conducted and thus read errors and read failures can be minimized.

The invention claimed is:

1. Method of manufacturing silicon wafers comprising the steps of:
   texturing, doping and diffusion treating a wafer to produce characteristic semiconductor properties,
   reading an individual identification pattern comprising a number of lines on the peripheral edge of the wafer to identify the ingot or column the wafer was cut from, and
   reading a marking having a position line on the peripheral edge of the wafer which is inclined with respect to a longitudinal line of an ingot or column the wafer was cut from to identify the position of the wafer within the ingot or column, wherein the individual identification pattern of lines comprises a plurality of parallel lines which are distanced from each other, the lines being of different depth and wherein the individual identification pattern is provided by an individual sequence of depths of the plurality of lines, wherein the ingot or column comprises a first axial section and a second axial section extending axially along the ingot or column, wherein the first axial section comprises a first identification pattern at an upper region of the ingot or column and a first inclined position line at a lower region of the ingot or column, and wherein the second axial section comprises a second identification pattern at the lower region and a second inclined position line at the upper region.

2. Method according to the claim 1, further comprising the step of slicing the ingot or column into a number of wafers and marking the ingot or column, wherein the marking step is done before the slicing step.

3. Method according to claim 1, further comprising the steps of
   squaring the ingot or column by cutting it in an axial direction and
   marking the ingot or column on at least one of the flattened surfaces provided by the squaring process.

4. Method according to claim 1, wherein a stack of marked wafers is read out in whole.

5. Method according to claim 1, wherein the marking is used for precise adjustment of the placement or orientation of the wafer.

* * * * *